(12) United States Patent
Sidelnicov et al.

(10) Patent No.: US 9,524,962 B2
(45) Date of Patent: Dec. 20, 2016

(54) SEMICONDUCTOR DEVICE COMPRISING AN E-FUSE AND A FET

(71) Applicant: GLOBALFOUNDRIES Inc., Grand Kayman (KY)

(72) Inventors: Andrei Sidelnicov, Dresden (DE); Andreas Kurz, Dresden (DE); Alexandru Romanescu, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/136,581

(22) Filed: Dec. 20, 2013

(65) Prior Publication Data

US 2015/0179632 A1    Jun. 25, 2015

(51) Int. Cl.
*H01L 29/49* (2006.01)
*H01L 23/62* (2006.01)
*H01L 21/285* (2006.01)
*H01L 27/06* (2006.01)
*H01L 23/525* (2006.01)
*H01L 29/51* (2006.01)
*H01L 29/66* (2006.01)

(52) U.S. Cl.
CPC ....... *H01L 27/0629* (2013.01); *H01L 23/5256* (2013.01); *H01L 29/495* (2013.01); *H01L 29/4966* (2013.01); *H01L 29/517* (2013.01); *H01L 29/66545* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 6,821,887 B2 | 11/2004 | Wieczorek et al. | |
| 2004/0251549 A1* | 12/2004 | Huang et al. | 257/758 |
| 2008/0079090 A1 | 4/2008 | Hwang et al. | |
| 2009/0026574 A1* | 1/2009 | Kim | H01L 23/5256 257/529 |
| 2009/0117274 A1 | 5/2009 | Ma et al. | |
| 2010/0301417 A1 | 12/2010 | Cheng et al. | |

(Continued)

OTHER PUBLICATIONS

Office Action from related U.S. Appl. No. 14/136,815 dated Feb. 6, 2015.

(Continued)

*Primary Examiner* — Calvin Choi
*Assistant Examiner* — Xiaoming Liu
(74) *Attorney, Agent, or Firm* — Amerson Law Firm, PLLC

(57) ABSTRACT

A method of forming a semiconductor device including the steps of forming an electrically programmable fuse (e-fuse) on an isolation region and a transistor on an active region of a wafer, wherein forming the transistor includes forming a dummy gate above a substrate, removing the dummy gate and forming a metal gate in place of the dummy gate, and forming the e-fuse includes forming a metal-containing layer above the isolation region, forming a semiconductor layer on the metal-containing layer during the process of forming the dummy gate and of the same material as the dummy gate, forming a hard mask layer on the semiconductor layer formed on the metal-containing layer, and forming contact openings in the hard mask layer and semiconductor layer during the process of removing the dummy gate.

17 Claims, 4 Drawing Sheets

(56) References Cited

U.S. PATENT DOCUMENTS

| | | | |
|---|---|---|---|
| 2011/0057267 A1* | 3/2011 | Chuang | H01L 21/823842 |
| | | | 257/380 |
| 2012/0187528 A1 | 7/2012 | Cheng et al. | |
| 2012/0217589 A1* | 8/2012 | Yin | H01L 21/28518 |
| | | | 257/408 |
| 2015/0211126 A1 | 7/2015 | Ma | |

OTHER PUBLICATIONS

Final Office Action from related U.S. Appl. No. 14/136,815 dated Aug. 17, 2015.
Office Action from related U.S. Appl. No. 14/136,815 dated Feb. 22, 2016.

\* cited by examiner

SEMICONDUCTOR DEVICE COMPRISING AN E-FUSE AND A FET

BACKGROUND OF THE INVENTION

1. Field of the Invention

Generally, the present disclosure relates to the field of integrated circuits and semiconductor devices, and, more particularly, to electrically programmable fuses (e-fuses) and methods of manufacturing e-fuses in the context of the gate last (replacement gate) approach.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors, wherein, for many types of complex circuitry, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer.

A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed between the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length is a dominant design criterion for accomplishing an increase in the operating speed of the integrated circuits.

Particularly for transistor devices with very short channel lengths, for example, of some 10 nm, gate structures with high-k dielectric gate insulating layers and one or more metal layers functioning as a gate electrode have been provided that show improved operational characteristics as compared to conventional silicon dioxide/polysilicon gates. The high-k insulation layers may include or consist of tantalum oxide, hafnium oxide, titanium oxide or hafnium silicates, for example. Furthermore, in the high-k/metal gate (HKMG) technology, a thin "work function metal" layer is typically inserted between the high-k dielectric and the gate material placed above the high-k dielectric. The threshold voltage can thus be adjusted by varying the thickness of the metal layer. The gate metal layer may comprise, for example, tantalum (Ta), tungsten (W), titanium nitride (TiN) or tantalum nitride (TaN). On the other hand, the work function metal layer may comprise metals such as aluminum and lanthanum. Work function metals may also be included in the gate metal layer.

There are basically two well-known processing methods for forming a planar or 3D transistor with a HKMG structure: the so-called "gate last" or "replacement gate" technique and the so-called "gate first" technique. In the replacement gate technique, a so-called "dummy" or sacrificial gate structure is initially formed and remains in place as many process operations are performed to form the device, for example, the formation of doped source/drain regions, performing an anneal process to repair damage to the substrate caused by the ion implantation processes and to activate the implanted dopant materials. At some point in the process flow, the sacrificial gate structure is removed to define a gate cavity where the final HKMG gate structure for the device is formed. Using the "gate first" technique, on the other hand, involves forming a stack of layers of material across the substrate, wherein the stack of materials includes a high-k gate insulation layer, one or more metal layers, a layer of polysilicon and a protective cap layer, for example, silicon nitride. One or more etching processes are performed to pattern the stack of materials to thereby define the basic gate structures for the transistor devices.

Reducing the typical dimensions of integrated circuits also leads to an increased probability of failure of single chip components, which in turn results in a decrease of product yield. Typically, damage of a single component, such as a single metal link, a transistor or a resistor, causes the entire integrated circuit to be unusable. This is obviously in contrast with the semiconductor industry endeavor of achieving ever increasing product quality, reliability and throughput.

In order to improve the product yield, a technique has been developed of "trimming" or electrically excluding circuit blocks which are no longer operable. This technique, particularly used during manufacturing of memory arrays, relies on redundant circuit blocks which can be incorporated into the main integrated circuit and activated once a defective circuit portion has been detected. On the other hand, the defective circuit block may be trimmed or electrically removed by blowing a fuse or a group of fuses which can electrically disconnect the defective block from the main circuit when in the open configuration. Reprogramming of an integrated circuit is thus rendered possible in a dynamic manner, even after the chip has been manufactured.

One of the most successfully used types of fuses used for enabling dynamic chip reprogramming is the so-called electrically programmable fuse (e-fuse). The cross-section of a typical e-fuse 100 formed during a manufacturing flow according to the HKMG gate first technology is shown in FIG. 1.

E-fuse 100 is formed on an isolation region 112 of a substrate (not shown). The substrate may be any appropriate carrier for a semiconductor integrated device. The isolation region 112 may, for example, have been formed by means of shallow trench isolation (STI).

E-fuse 100 includes a metal layer 124 formed above the surface of the isolation region 112. The material or material mixture constituting the layer 124 are typically the same as the material or material mixture making up the gate metal layer in the HKMG technology. Although not shown in the figure, a high-k dielectric layer may be interposed between the metal layer 124 and the surface of the isolation region 112.

A semiconductor layer 144 is then formed on the metal layer 124. The semiconductor material forming the layer 144 is preferably the same material used for forming the gate material layer on the gate metal layer. Thus, the semiconductor layer 144 is usually comprised of polysilicon. A metal silicide layer 164, typically nickel silicide, is finally formed on the surface of the semiconductor layer 144. The metal silicide layer 164 is conveniently formed during the same silicidation process used for forming electrical contacts to the electrodes (gate, source and drain) of a FET.

The metal silicide layer 164 includes a first electrode 164a and a second electrode 164c arranged at opposite ends of the layer 164. The first electrode 164a and the second electrode 164c could, for example, be the anode and the cathode of the e-fuse 100. Contact terminals 174a and 174b are then formed so as to provide an electrical connection to the first electrode 164a and the second electrode 164c, respectively. The contact terminals 174a and 174b are typically comprised of a metal with a high electrical conductivity.

When the e-fuse 100 is un-programmed, the metal silicide layer 164 is continuous and provides an electrical connection between the first electrode 164a and the second electrode 164b, thus presenting a low electrical resistance between the terminals 174a and 174b. The e-fuse 100 may then be programmed by applying a predetermined electrical bias between terminals 174a and 174b, thereby inducing a current to flow across the e-fuse 100. Since the resistivity of the semiconductor layer 144 is much greater than that of the silicide layer 164, almost all current flows through the latter layer. If the current intensity exceeds a predetermined threshold, electromigration occurs in the silicide layer 164, resulting in transport of the metal silicide material constituting the layer 164 towards the anode. After a sufficient amount of material has been transferred, one of the two electrodes 164a and 164c representing the anode, the e-fuse 100 switches to the programmed state when a gap is formed in the metal silicide layer 164, thereby resulting in an open circuit between the two terminals 174a and 174b. The electrical resistance of the programmed e-fuse 100 thus rises by several orders of magnitude with respect to the resistance in the un-programmed state.

However, the configuration shown in FIG. 1 is not suitable in the context of the gate last (replacement gate) technology wherein silicon has to be protected from silicidation in order to remove all of the amorphous or polysilicon in order to replace it with a metal gate. Thus, conventional e-fuses with silicided (poly) silicon cannot be used within the replacement gate process. On the other hand, e-fuses realized in back end-of-line (Beol) stacks suffer from the need for relatively high currents for blowing the fuses.

In view of the situation described above, the present disclosure provides techniques that allow for the formation of semiconductor devices comprising reliably operating e-fuses in the context of HG/MG gate last processes and semiconductor devices operating e-fuses.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method of forming a semiconductor device or integrated circuit includes the steps of forming an electrically programmable fuse (e-fuse) on an isolation region and a transistor on an active region of a wafer, wherein forming the transistor includes forming a dummy gate above a substrate, removing the dummy gate and forming a metal gate in place of the dummy gate above the substrate, and forming the e-fuse includes forming a metal-containing layer above the isolation region, forming a semiconductor layer on the metal-containing layer during the process of forming the dummy gate and of the same material as the dummy gate, forming a hard mask layer on the semiconductor layer formed on the metal-containing layer, and forming contact openings in the hard mask layer and semiconductor layer during the process (in the same process step) of removing the dummy gate.

Moreover, a method of forming a semiconductor device or integrated circuit is provided including the steps of forming an e-fuse on an isolation region of a wafer and a transistor on an active region of the wafer. Forming the transistor includes forming a dummy gate above a substrate in a first process, wherein the dummy gate comprises a semiconductor material, forming a hard mask layer on the dummy gate in a second process, removing the hard mask layer and the dummy gate in a third process, and forming a metal gate material above the substrate in a fourth process. Forming the e-fuse includes forming a metal-containing layer above the isolation region, forming a semiconductor layer on the metal-containing layer in the first process (i.e., during the same process as the formation of the dummy gate), forming the hard mask on the semiconductor layer in the second process (i.e., during the same process as the formation of the hard mask layer on the dummy gate), forming contact openings in the semiconductor layer and the hard mask formed on the semiconductor layer in the third process (i.e., during the same process as the removal of the hard mask layer and the dummy gate), and forming metal contacts in the formed contact opening in the fourth process (i.e., during the same process as the formation of the metal gate).

A semiconductor device according to an embodiment includes an electrically programmable fuse (e-fuse) formed on an isolation region and a transistor formed on an active region of a wafer. The e-fuse includes a dielectric layer formed on the isolation region and of the same material as a gate dielectric layer formed in the transistor, a metal-containing layer formed on the dielectric layer and metal contacts contacting the metal-containing layer and being formed of the same material as a metal gate of the transistor.

The metal-containing layer in the above examples may be formed as a relatively thin layer. For example, the thickness of the metal-containing layer is below 20 nm, in particular, below 10 or even below 5 nm, for example.

BRIEF DESCRIPTION OF THE DRAWINGS

The disclosure may be understood by reference to the following description taken in conjunction with the accompanying drawings, in which like reference numerals identify like elements, and in which.

Figure 1:
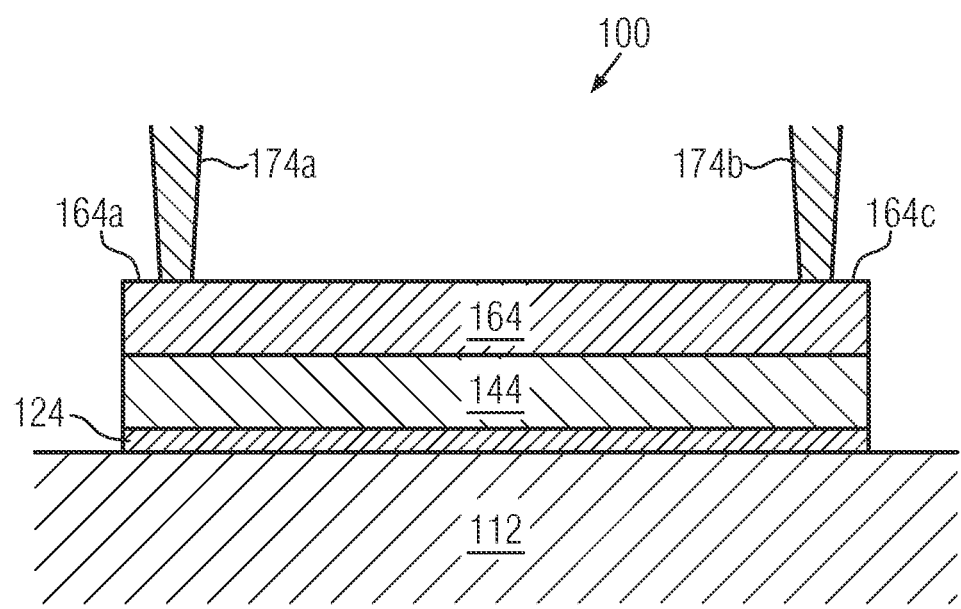
FIG. 1 illustrates a conventional e-fuse manufactured in the context of an HKMG gate first process.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

It should be understood that, unless otherwise specifically indicated, any relative positional or directional terms that may be used in the descriptions below—such as "upper," "lower," "on," "adjacent to," "above," "below," "over," "under," "top," "bottom," "vertical," "horizontal" and the like—should be construed in light of that term's normal and everyday meaning relative to the depiction of the components or elements in the referenced figures. For example, referring to the schematic cross-section of the e-fuse 100 depicted in FIG. 1, it should be understood that the layer 144 is formed "above" the surface of the isolation region 112, whereas the layer 124 is formed "on" the surface of the isolation region 112 in those instances in which no other material is present between the layer 124 and the isolation region 112.

The present disclosure provides a method for the manufacture of a semiconductor device comprising an e-fuse and a FET in the context of HKMG gate last techniques. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc. Particularly, a metal-containing layer is formed as a fuse link above a dielectric layer. The main body of the e-fuse comprises a semiconductor material formed above the metal-containing layer and a hard mask layer atop the semiconductor material. Metal contacts are formed in openings of the semiconductor material and the hard mask layer in order to contact the metal-containing layer.

Figure 2A:
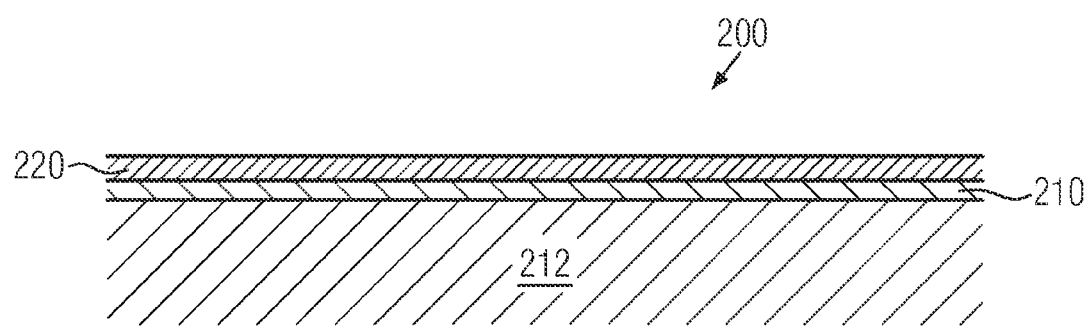
FIGS. 2a-2f shows an e-fuse manufactured according to an illustrative embodiment.

In the following, manufacture of an inventive e-fuse in the context of the overall manufacturing process of an integrated circuit comprising FETs formed on the basis of the gate last technique is described. An exemplary starting point for an example of the provided method and resulting e-fuse is shown in FIG. 2a. The configuration shown in FIG. 2a comprises an isolation region 212, for instance, a shallow trench isolation (STI) of a semiconductor substrate (not shown). The semiconductor substrate may be any suitable carrier for an integrated semiconductor device. The semiconductor substrate may comprise a semiconductor layer, which in turn may be comprised of any appropriate semiconductor material, such as silicon, silicon/germanium, silicon/carbon, other II-VI or III-V semiconductor compounds and the like. The semiconductor layer may comprise a significant amount of silicon due to the fact that semiconductor devices of high integration density may be formed in volume production on the basis of silicon due to the enhanced availability and the well-established process techniques developed over the last decades. However, any other appropriate semiconductor materials may be used, for instance, a silicon-based material containing other iso-electronic components, such as germanium, carbon and the like. The semiconductor substrate may be a silicon substrate, in particular, a single crystal silicon substrate. Other materials may be used to form the semiconductor substrate as, for example, germanium, silicon/germanium, gallium phosphate, gallium arsenide, etc.

Furthermore, the semiconductor substrate and the semiconductor layer may define a silicon-on-insulator (SOI) configuration. For example, the substrate may be comprised of a semiconductor material in a crystalline, polycrystalline or amorphous form. The substrate could comprise an oxide sandwiched between two semiconductor layers, such as those used in the (SOI) technology. A semiconductor layer, for example comprising mono-crystalline silicon, could then be formed in the substrate. The semiconductor layer could then be divided into a plurality of active regions, each of them adapted to host one or more N-channel FETs and/or P-channel FETs.

The isolation region 212 could, for example, separate neighboring active regions of the semiconductor layer. The isolation region 212 could comprise an oxide, such as, for example, silicon dioxide ($SiO_2$), and could be formed by means of a well-established technique. For example, the isolation region 212 could be formed by means of local oxidation of silicon (LOCOS), or preferably by the shallow trench isolation (STI) technique. STI is particularly suitable for highly integrated devices, e.g., for semiconductor manufacturing technologies beyond the 0.5-μm technology.

A dielectric layer 210 is formed on the isolation region 212. The dielectric layer 210 is also formed in the active region where it functions as a gate dielectric in a transistor device. In particular, the dielectric layer 210 may be a high-k material layer with a permittivity k larger than 20, for example. This high-k material layer may comprise the materials constituting the gate dielectric layer and may be formed by means of the same deposition as used for forming the dielectric layer giving rise to the gate dielectric layer after an appropriate patterning step. The high-k material layer could thus comprise dielectric materials such as hafnium oxide ($HfO_2$), hafnium silicon oxide (HfSiO), tantalum oxide ($Ta_2O_5$), strontium titanium oxide ($SrTiO_3$), zirconium oxide ($ZrO_2$), etc.

The configuration shown in FIG. 2a further comprises a metal-containing layer 220 formed on the dielectric layer 210 above the isolation region 212. The metal-containing layer 220 may comprise at least one of titanium nitride (TiN), tantalum nitride (TaN), tantalum (Ta), tungsten (W), for example. The metal-containing layer 220 is relatively thin with a thickness below 20 nm, in particular, below 10 or even below 5 nm, for example.

Figure 2B:
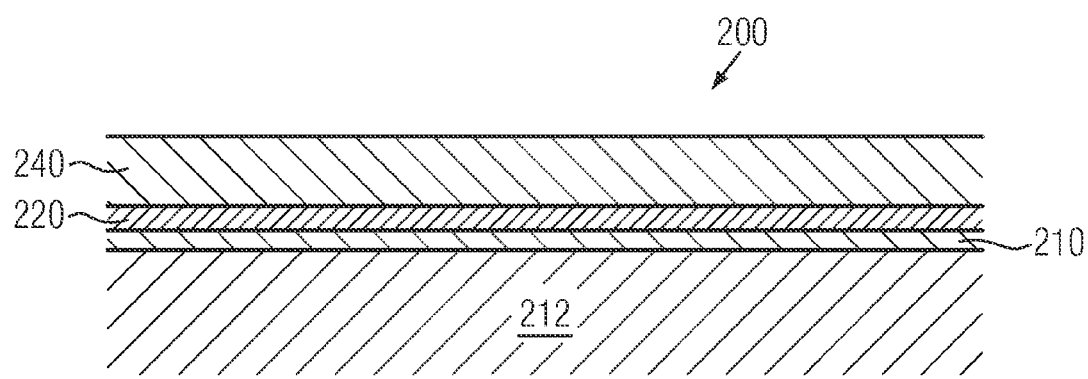

After depositing the metal-containing layer 220, a semiconductor layer 240 is formed on the metal-containing layer 220, as illustrated in FIG. 2b. In some embodiments, the semiconductor layer 240 may be conveniently formed by means of the same deposition process used for forming the semiconductor layer, which, after an appropriate patterning step, results in the dummy gate material formed on the gate metal layer in the HKMG gate last technology. Thus, the semiconductor layer 240 may comprise silicon. According to a particular embodiment, the semiconductor layer 240 comprises undoped polycrystalline silicon.

Figure 2C:
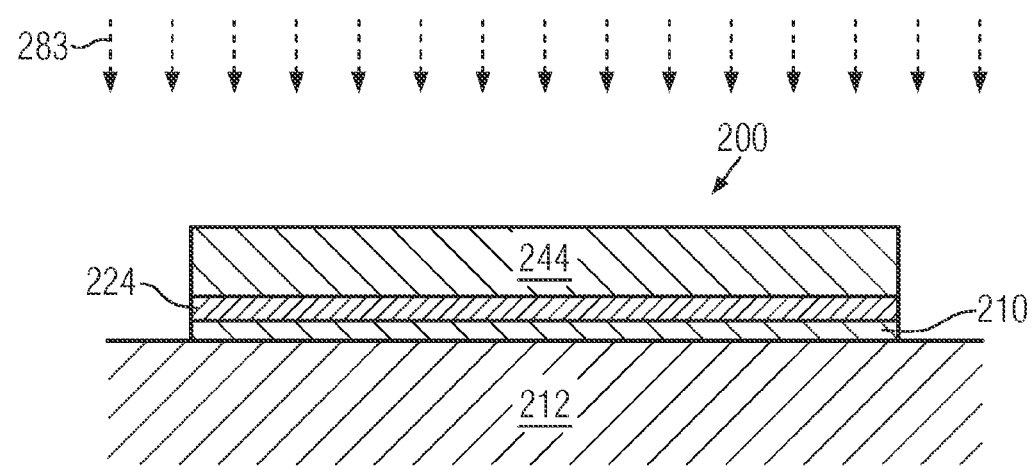
Figure 2D:
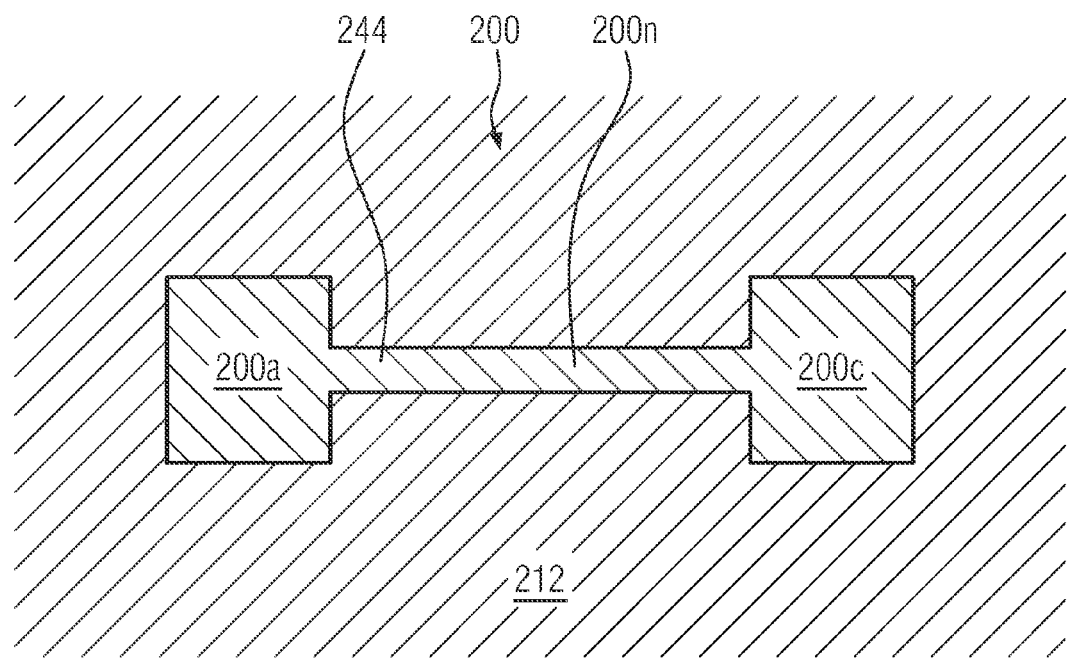

FIGS. 2c and 2d show a cross-section and a top-view of the e-fuse 200 in a manufacturing stage subsequent to that shown in FIG. 2b.

After depositing the metal-containing layer 220 and semiconductor layer 240, a patterning process 283 is carried out in order to structure layers 210, 220 and 240. The patterning process 283 might comprise a photolithography step performed in order to form a pattern in a photoresist layer deposited on the surface of the e-fuse 200. The photolithography step, performed, for example, with the aid of a shadow mask, may then be followed by one or a series of etches carried out in order to transfer the pattern from the photoresist layer to the dielectric layer 210, the metal-containing layer 220 and the semiconductor layer 240. In other implementations, the patterning 283 may be performed by using one or more wet or dry etches after laying a hard mask having the desired pattern on the surface of the e-fuse 200. In a particular embodiment, the patterning 283 is carried out during the same patterning step used for structuring the gate structure of a FET manufactured according to the HKMG technology.

Patterning 283 causes the undesired portion of the layers 210, 220 and 240 to be removed. As shown in FIGS. 2c and 2d, after completion of the patterning process 283, the e-fuse 200 is comprised of a portion 224 of the metal-containing layer 220 and a portion 244 of the semiconductor layer 240.

It should be noticed that, in the embodiment shown in FIGS. 2c and 2d, patterning 283 results in the metal-containing layer 220 and the semiconductor layer 240 being structured so as to have the same shape. Since, according to this embodiment, patterning 283 is performed by using the same photoresist mask or hard mask after etching the metal-containing layer 220 and the semiconductor layer 240, the metal-containing layer portion 224 and the semiconductor layer portion 244 resulting from patterning 283 have the same shape.

In other embodiments not shown in the figures, the metal-containing layer 220 is deposited and patterned before deposition of the semiconductor layer 240. The semiconductor layer 240 is subsequently deposited on the patterned metal layer and, if desired, may also be patterned in order to assume a desired shape. After completion of the patterning process, the semiconductor layer preferably covers at least the entire surface of the underlying patterned metal layer.

Again with reference to FIGS. 2c and 2d, the patterned metal-containing layer 224 and the patterned semiconductor layer 244 are structured so that the e-fuse 200 has a first end portion 200a and a second end portion 200c arranged opposite each other, as shown in FIG. 2d. The left-hand portion of the metal layer 224 included in the first end portion 200a comprises a first electrode of the e-fuse 200. Analogously, the right-hand portion of the metal-containing layer 224 included in the second end portion 200c comprises a second electrode of the e-fuse 200. For example, the first electrode could be the anode and the second electrode the cathode of the e-fuse 200, or vice versa. Thus, the anode and cathode of the e-fuse 200 are included in opposite end portions of the patterned metal-containing layer 224.

After completion of the patterning process 283, the metal-containing layer 220 and the semiconductor layer 240 comprise a narrow portion or neck 200n arranged between the first end portion 200a and the second end portion 200c. The width (dimension along the vertical direction in FIG. 2d) of the narrow portion 200n is considerably less than the width of both the first end portion 200a and the second end portion 200c of the e-fuse 200. The narrow portion 200n of the metal-containing layer 224 is adapted to form an interruption upon flow of a current exceeding a predetermined threshold intensity. The current may be induced through the narrow portion 200n of the metal-containing layer 224 by applying an electric bias between the first and the second electrode of the e-fuse 200.

Figure 2E:
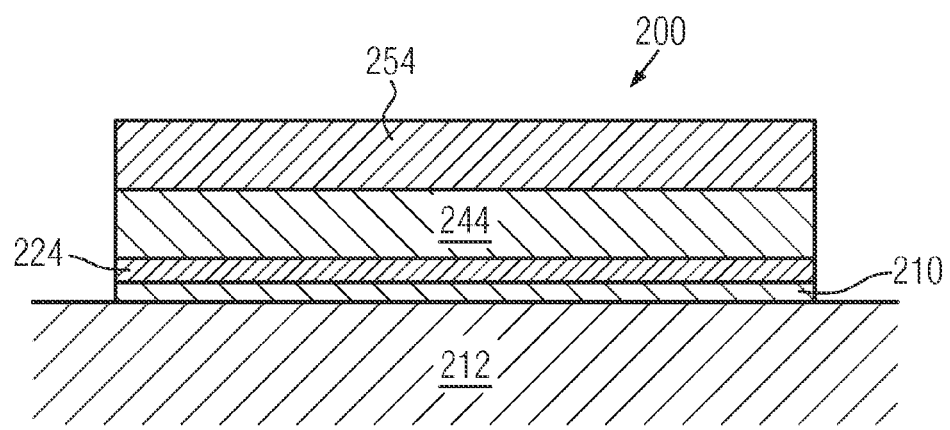

FIG. 2e shows a cross-section of the e-fuse 200 in a manufacturing stage subsequent to that shown in FIGS. 2c and 2d. After formation of the patterned metal-containing layer 224 and the patterned semiconductor layer 244, a hard mask layer 254 is deposited onto the surface of the patterned semiconductor layer 244. The hard mask layer 254 may comprise a dielectric material such as, for example, silicon nitride ($Si_3N_4$) or silicon dioxide ($SiO_2$). The hard mask layer 254 may be formed by means of a deposition followed by a patterning process carried out during any appropriate manufacturing stage prior to the silicidation process performed in order to form metal silicide regions electrically contacting the electrodes of the FETs included in an integrated circuit. Preferably, the hard mask layer 254 is formed after forming the replacement gate structure of the FETs.

The integrated circuit in which the e-fuse 200 is included usually undergoes a silicidation process after the hard mask layer 254 has been formed. The silicidation process is well established and is aimed at forming a metal silicide layer on the surface of the source/drain regions of FETs. The silicon replacement gate structures of the FETs formed in the integrated circuit are protected against silicidation by the hard mask layer. The silicidation process starts with deposition of a metal film, typically nickel, followed by a heating step triggering a chemical reaction between the metal particles of the deposited film in contact with those portions of the circuit surface exposing a semiconductor, typically silicon.

As the material comprised in the hard mask layer 254 does not react with the metal particles (e.g., nickel particles) during the silicidation process, the semiconductor layer 244 is not affected by the silicidation process and no metal silicide is formed in or on top of the e-fuse 200. Moreover, the replacement gate of the transistor is not silicided due to the protecting hard mask formed thereon.

Figure 2F:
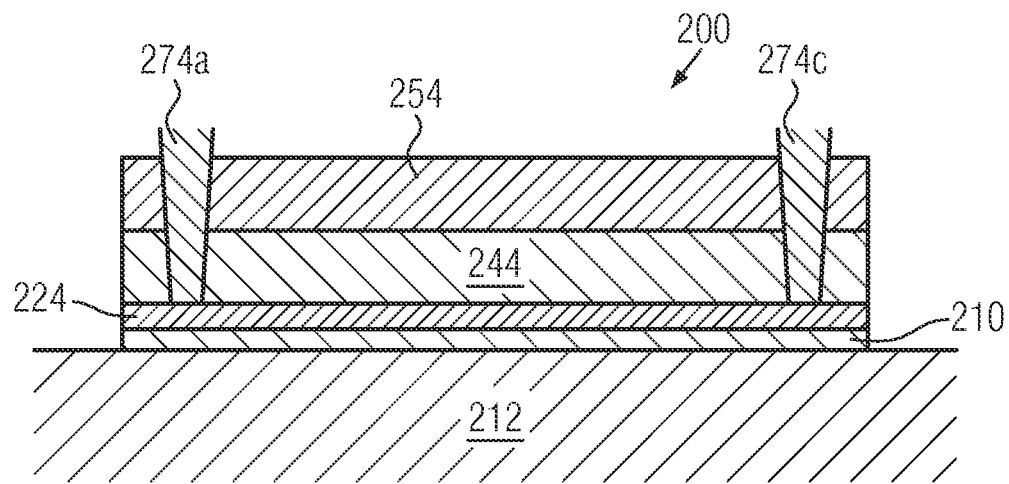

FIG. 2f shows a cross-sectional view of the e-fuse 200 in a manufacturing stage subsequent to that shown in FIG. 2e. Contact openings are formed in the hard mask layer 254 and the semiconductor layer 244 during the same process of etching (removal) of replacement gates of FETs in the active region. The placeholder material of the dummy gate is etched selectively to dielectric materials, for example, of sidewall spacers. For this purpose, a plurality of wet chemical etch recipes are available, which may remove silicon material selectively to silicon dioxide, silicon nitride and the like. For instance TMAH (tetra methyl ammonium hydroxide) may be used, which represents a chemical agent which may etch silicon at elevated temperatures in the range of approximately 50-80° C. with a high degree of selectivity with respect to silicon dioxide and silicon nitride. Etching of the contact openings is stopped by the metal-containing layer 224 functioning as an etch stop layer. On the other hand, etching of the hard mask layer 254 and the semiconductor layer 244 over the fuse body may be blocked by the same photo mask layer that is used for the protection of resistors formed in the entire manufacturing process of the integrated circuit.

Electrical contacts 274a and 274c to the metal-containing layer 224 are formed in correspondence to the first end portion 200a and the second end portion 200c of the e-fuse 200. The above-mentioned contact openings are filled with a metal having a high electrical conductivity. For example, the metal included in the contacts 274a and 274b could comprise copper, tungsten, aluminum and the like. The metal in contacts 274a and 274b is thus in electrical contact with the two electrodes of opposite polarity included in the metal-containing layer 224, thus providing an electrical connection to the anode and cathode of the e-fuse 200. In particular, contacts 274a and 274b are formed during the same manufacturing process in which the gate metals of the FETs replacing the dummy gates are formed.

Figure 3:
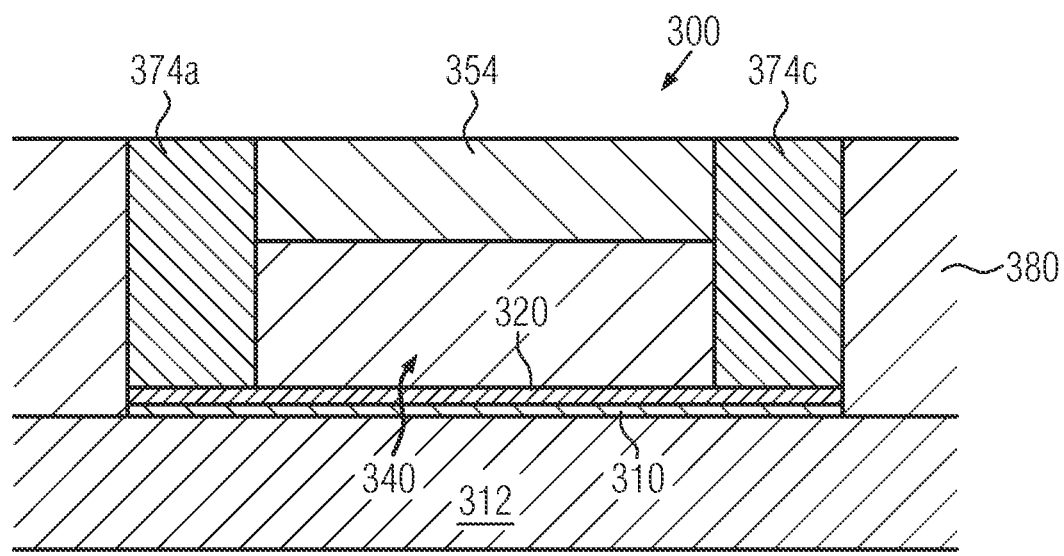
FIG. 3 shows an e-fuse manufactured according to another illustrative embodiment.

It is noted that electrical contacts to transistor electrodes are typically formed after forming the transistors and depositing an interlayer dielectric (ILD) onto the surface of the integrated circuit. Accordingly, FIG. 3 shows another embodiment of an e-fuse 300 according to the present invention. The e-fuse 300 is formed above an isolation region 312, for example, provided in the form of an STI separating different active regions of a wafer. A dielectric layer 310 similar to the one described with reference to FIGS. 2a-2f is formed on the isolation region 312. A metal-containing layer 320 similar to the one described with reference to FIGS. 2a-2f is formed on the dielectric layer 310. An undoped (and not silicided) polysilicon layer 340 is formed on the metal-containing layer 320 and covered by a hard mask layer 354 that, for example, may comprise some nitride material. The entire e-fuse 300 is surrounded by an ILD material 380. Contacts 374a and 374c are formed for electrically contacting the metal-containing layer 320 functioning as the fuse link.

It is noted that, according to an embodiment, the formation of the dielectric layer 310 and polysilicon layer 340 could, in principle, be skipped in the configuration illustrated in FIG. 3.

The e-fuse 200 shown in the accompanied FIGS. 2a-2f is in the un-programmed state, wherein a low resistance value is measured between contacts 274a and 274b, since the metal-containing layer 224 is continuous. When an electrical bias is established between the contacts 274a and 274b, a current flows across the metal-containing layer 224. If the current intensity exceeds a threshold, electromigration occurs resulting in transport of metal constituting the metal-containing layer 224 from the cathode to the anode, i.e., from the first end portion 200a to the second end portion 200c or vice versa. Electromigration results in wear and increasing thinning of the narrow portion 200n of the metal-containing layer 224. After a sufficient amount of metal has been transferred to the anode, an interruption of the metal-containing layer 224 is formed in correspondence to the narrow portion 200n. As a consequence, the metal layer 224 is split into two completely disconnected portions. The formation of the interruption causes the resistance between contacts 274a and 274b to increase by several orders of magnitude and the e-fuse 200 to switch from the un-programmed to the programmed state. The contact openings for the contacts 274a and 274b are formed in the same process step carried out for etching the replacements gates of FETs according to the gate last approach. The metal contacts 274a and 274b are formed in the same process step carried out for forming the metal gates (metal gate portions) of FETs according to the gate last approach. The e-fuse 300 shown in FIG. 3 works similarly.

As a result, the present disclosure provides manufacturing techniques to obtain a reliably operating fuse in the context of the HKMG techniques wherein FETs are formed based on the replacement gate approach.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor device comprising the steps of forming an electrically programmable fuse (e-fuse) on an isolation region and a transistor on an active region of a wafer, wherein:

forming said transistor comprises forming a dummy gate above a substrate, removing said dummy gate and forming a metal gate in place of said dummy gate above said substrate; and forming said e-fuse comprises forming a metal-containing layer above said isolation region, forming a semiconductor layer on said metal-containing layer during the process of forming said dummy gate, the semiconductor layer being made of the same material as said dummy gate, forming a hard mask layer above and in contact with an upper surface of said semiconductor layer, forming an interlayer dielectric material above said hard mask layer, and forming contact openings extending through at least said hard mask layer and said semiconductor layer so as to thereby expose portions of said metal-containing layer, wherein said contact openings are formed through at least said hard mask layer and said semiconductor layer during the process of removing said dummy gate.

2. The method of claim 1, wherein forming said e-fuse further comprises forming metal contacts in said contact openings during the process of forming said metal gate, and wherein the metal contacts extend through at least said hard mask layer and said semiconductor layer are made of the same material as said metal gate.

3. The method of claim 1, wherein said contact openings are formed during the process of removing said dummy gate.

4. The method of claim 1, wherein forming said e-fuse further comprises forming said contact openings in said interlayer dielectric material and forming conductive metal contacts in said contact openings, said conductive metal contacts extending through said interlayer dielectric material, said hard mask layer, and said semiconductor layer.

5. A method of forming a semiconductor device comprising the steps of forming an e-fuse on an isolation region and a transistor on an active region of a wafer, wherein:
  forming said transistor comprises:
    forming a semiconductor material layer above a substrate in a first process;
    forming a hard mask layer on and in contact with an upper surface of said semiconductor material layer in a second process;
    performing at least one patterning process to pattern said hard mask layer and said semiconductor material layer so as to thereby define a dummy gate comprised of said semiconductor material layer with a gate hard mask positioned thereabove;
    performing at least one third process to remove said gate hard mask and said dummy gate; and
    forming a metal gate material above said substrate in a fourth process; and
  forming said e-fuse comprises:
    forming a metal-containing layer above said isolation region;
    forming said semiconductor material layer on said metal-containing layer in said first process;
    forming said hard mask layer on and in contact with an upper surface of said semiconductor material layer in said second process;
    forming an interlayer dielectric material above said hard mask layer;
    forming contact openings extending through at least said semiconductor material layer and said hard mask layer formed on and in contact with an upper surface of said semiconductor material layer; and
    forming metal contacts in said contact openings, said metal contacts extending through at least said hard mask layer and said semiconductor material layer.

6. The method of claim 5, further comprising forming a resistor in said active region or on another region of said wafer and forming a photo mask on said resistor and said hard mask layer formed on said semiconductor layer of said e-fuse before removing said dummy gate.

7. The method of claim 5, further comprising forming a dielectric layer on said isolation region and said active region.

8. The method of claim 7, wherein said dielectric layer is a high-k layer with a permittivity k of at least 10 and comprising at least one of hafnium oxide ($HfO_2$), hafnium silicon oxide (HfSiO), tantalum oxide ($Ta_2O_5$), strontium titanium oxide ($SrTiO_3$) and zirconium oxide ($ZrO_2$).

9. The method of claim 7, further comprising forming said interlayer dielectric material above said isolation region and said active region.

10. The method of claim 5, wherein said metal-containing layer comprises one of titanium nitride (TiN), tantalum nitride (TaN), tantalum (Ta), and tungsten (W).

11. The method of claim 5, further comprising performing a silicidation process in said active region before forming said contact openings.

12. The method of claim 5, wherein said contact openings are formed in said at least one third process.

13. The method of claim 12, wherein said metal contacts are formed in said fourth process.

14. The method of claim 5, wherein forming said e-fuse comprises forming said contact openings in said interlayer dielectric material, said metal contacts extending through said interlayer dielectric material, said hard mask layer, and said semiconductor material layer.

15. A method of forming a semiconductor device comprising the steps of forming an electrically programmable fuse (e-fuse) above an isolation region, said e-fuse comprising a metal-containing layer and a semiconductor material portion positioned above said metal-containing layer, and a transistor above an active region of a semiconductor substrate, wherein the method comprises:
  forming a semiconductor material layer above said active region and said metal-containing layer positioned above and in contact with an upper surface of said isolation region;
  forming a hard mask layer above said semiconductor material layer;
  performing at least one patterning process so as to define:
    a dummy gate comprised of said semiconductor material layer positioned above said active region and a gate hard mask comprised of said hard mask layer positioned above and in contact with an upper surface of said dummy gate; and
    said semiconductor material portion of said e-fuse that is positioned on said metal-containing layer, said semiconductor material portion of said e-fuse being made of a portion of said semiconductor material layer, and an e-fuse hard mask layer comprised of said hard mask layer positioned above and in contact with an upper surface of said semiconductor material portion of said e-fuse;
  performing at least one process operation to remove said dummy gate so as to define a replacement gate cavity and, at the same time, remove portions of said semiconductor material portion of said e-fuse so as to define contact openings that extend through at least said semiconductor material portion and said e-fuse hard mask portion of said e-fuse and expose portions of said metal-containing layer;
  depositing a metal for a metal gate structure for said transistor device in said replacement gate cavity and, at the same time, depositing said metal in said contact openings on said exposed portions of said metal-containing layer of said e-fuse; and
  forming an interlayer dielectric material above said e-fuse hard mask portion of said e-fuse.

16. The method of claim 15, wherein performing said at least one patterning process, comprises:
  performing a first etching process to pattern said hard mask layer and thereby define said gate hard mask and said e-fuse hard mask; and
  after performing said first etching process, performing a second etching process to define said dummy gate and said semiconductor material portion of said e-fuse.

17. The method of claim 15, wherein performing said at least one process operation to remove said dummy gate so as to define a replacement gate cavity and, at the same time, remove portions of said semiconductor material portion of said e-fuse so as to define contact openings comprises performing a common process operation to remove said gate hard mask while forming portions of said contact openings that extend through said e-fuse hard mask.

* * * * *